United States Patent
Ikeda et al.

(10) Patent No.: US 9,818,757 B2
(45) Date of Patent: Nov. 14, 2017

(54) SEMICONDUCTOR DEVICE

(71) Applicant: Toshiba Memory Corporation, Minato-ku (JP)

(72) Inventors: Keiji Ikeda, Kawasaki (JP); Kiwamu Sakuma, Yokkaichi (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/072,722

(22) Filed: Mar. 17, 2016

(65) Prior Publication Data

US 2017/0077230 A1    Mar. 16, 2017

(30) Foreign Application Priority Data

Sep. 15, 2015  (JP) ................................. 2015-181381

(51) Int. Cl.
*H01L 29/10* (2006.01)
*H01L 27/115* (2017.01)
(Continued)

(52) U.S. Cl.
CPC .. *H01L 27/11582* (2013.01); *H01L 21/28282* (2013.01); *H01L 27/11565* (2013.01);
(Continued)

(58) Field of Classification Search
None
See application file for complete search history.

(56) References Cited

U.S. PATENT DOCUMENTS

2009/0268522 A1  10/2009  Maejima
2009/0283737 A1*  11/2009  Kiyotoshi ............. H01L 27/101
257/2
(Continued)

FOREIGN PATENT DOCUMENTS

JP    2007-134593    5/2007
JP    2009-266944    11/2009
(Continued)

OTHER PUBLICATIONS

Ryota Katsumata et al. "Pipe-shaped BiCS Flash Memory with 16 Stacked layers and Multi-Level-Cell Operation for Ultra High Density Storage Devices", 2009 Symposium on VLSI Technology Digest of Technical Papers, Jun. 2009, 2 pages.
(Continued)

*Primary Examiner* — Whitney T Moore
(74) *Attorney, Agent, or Firm* — Oblon, McClelland, Maier & Neustadt, L.L.P.

(57) ABSTRACT

This semiconductor device comprises a plurality of first conductive layers arranged above a substrate in a first direction intersecting an upper surface of the substrate. The conductive layers includes a portion in which positions of ends of the first conductive layers made different from each other in a second direction intersecting the first direction. Furthermore, this semiconductor device comprises a transistor electrically connected to the portion of the conductive layers. That transistor comprises: a channel layer extending in the first direction; a gate electrode layer disposed in a periphery of the channel layer; and a gate insulating layer disposed between the channel layer and the gate electrode layer.

18 Claims, 17 Drawing Sheets

(51) Int. Cl.

| | | |
|---|---|---|
| *H01L 29/24* | (2006.01) | |
| *H01L 27/11582* | (2017.01) | |
| *H01L 21/28* | (2006.01) | |
| *H01L 29/786* | (2006.01) | |
| *H01L 29/792* | (2006.01) | |
| *H01L 27/11565* | (2017.01) | |
| *H01L 27/11575* | (2017.01) | |

(52) U.S. Cl.
CPC .... *H01L 27/11575* (2013.01); *H01L 29/7869* (2013.01); *H01L 29/7926* (2013.01)

(56) References Cited

U.S. PATENT DOCUMENTS

| | | |
|---|---|---|
| 2012/0187417 A1 | 7/2012 | Yamazaki et al. |
| 2012/0267623 A1 | 10/2012 | Isobe et al. |
| 2016/0064406 A1* | 3/2016 | Natori ............... H01L 27/11582 257/43 |

FOREIGN PATENT DOCUMENTS

| | | |
|---|---|---|
| JP | 2012-235107 | 11/2012 |
| JP | 2012-256835 | 12/2012 |

OTHER PUBLICATIONS

H. Tanaka et al. "Bit Cost Scalable Technology with Punch and Plug Process for Ultra High Density Flash Memory", 2007 Symposium on VLSI Technology Digest of Technical Papers, Jun. 2007, 2 pages.

* cited by examiner

SEMICONDUCTOR DEVICE

CROSS REFERENCE TO RELATED APPLICATIONS

This application is based on and claims the benefit of priority from prior Japanese Patent Application No. 2015-181381, filed on Sep. 15, 2015, the entire contents of which are incorporated herein by reference.

BACKGROUND

Field

Embodiments described below relate to a semiconductor device.

Description of the Related Art

One kind of semiconductor memory device is a flash memory. In particular, a NAND type flash memory is generally widely used since it is low cost and has a large capacity. Moreover, up to now, many technologies for further increasing the capacity of this NAND type flash memory have been proposed. One such technology is a structure in which memory cells are disposed three-dimensionally. In such a three-dimensional type semiconductor memory device, the memory cells are disposed in a certain direction, and, from each of those memory cells disposed in the certain direction, conductive layers extend in a horizontal direction to a substrate and are stacked in a vertical direction to the substrate.

In such a three-dimensional type semiconductor memory device, when the memory and the stacked number of conductive layers increases, the number of switching transistors for connecting the memory cells and an external circuit increases and an occupied area of the switching transistors increases. Therefore, it is required that the occupied area of these switching transistors is reduced.

BRIEF DESCRIPTION OF THE DRAWINGS

FIG. 4 is a perspective cross-sectional view of one memory cell MC, and so on.

DETAILED DESCRIPTION

A semiconductor device according to an embodiment described below comprises a plurality of first conductive layers arranged above a substrate in a first direction perpendicular to an upper surface of the substrate. The conductive layers includes a portion in which positions of ends of the first conductive layers made different from each other in a second direction intersecting the first direction. Furthermore, this semiconductor device comprises a transistor electrically connected to the portion of the conductive layers. That transistor comprises: a channel layer extending in the first direction; a gate electrode layer disposed in a periphery of the channel layer; and a gate insulating layer disposed between the channel layer and the gate electrode layer.

Next, nonvolatile semiconductor memory devices according to embodiments will be described in detail with reference to the drawings. Note that these embodiments are merely examples, and are not shown with the intention of limiting the present invention. Moreover, each of the drawings of the nonvolatile semiconductor memory devices employed in the embodiments below is schematic, and thicknesses, widths, ratios, and so on, of layers are different from those of the actual nonvolatile semiconductor memory devices.

The embodiments below relate to nonvolatile semiconductor memory devices having a structure in which a plurality of MONOS (Metal-Oxide-Nitride-Oxide-Semiconductor) type memory cells (transistors) are provided in a stacking direction, each of the MONOS type memory cells including: a semiconductor layer acting as a channel provided in a column shape perpendicularly to a substrate; and a gate electrode layer provided on a side surface of the semiconductor layer via a charge accumulation layer. However, this also is not intended to limit the present invention, and the present invention may also be applied to a memory cell of another form of charge accumulation layer, for example, a SONOS (Semiconductor-Oxide-Nitride-Oxide-Semiconductor) type memory cell or a floating gate type memory cell.

First Embodiment

Figure 1:
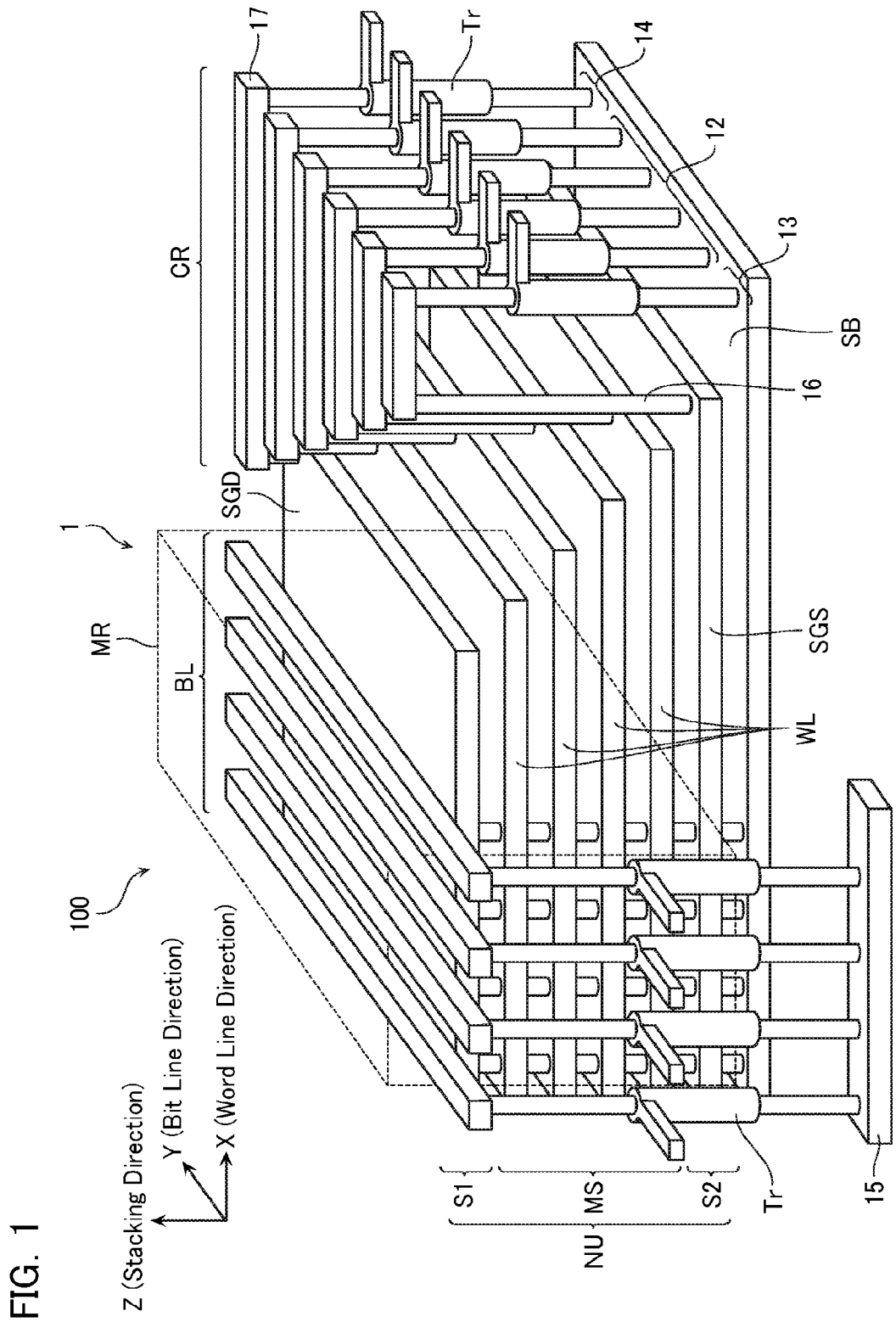
FIG. 1 is a perspective view showing schematically one example of a structure of a nonvolatile semiconductor memory device 100 of a first embodiment.

FIG. 1 is a perspective view showing schematically one example of a structure of a nonvolatile semiconductor memory device 100 of a first embodiment. The nonvolatile semiconductor memory device 100 includes: a memory cell array MR; a word line drive circuit 12; a source side select gate line drive circuit 13; a drain side select gate line drive circuit 14; a sense amplifier 15; a word line WL; a source side select gate line SGS; a drain side select gate line SGD; and a bit line BL.

The memory cell array MR comprises the following, on a semiconductor substrate (not illustrated in FIG. 1), namely: a memory string MS having a plurality of memory cells MC (memory transistors) connected in series therein; and a drain side select transistor S1 and a source side select transistor S2 respectively connected to both ends of the memory string MS. Note that the memory string MS and the drain side select transistor S1 and source side select transistor S2 connected to both ends of the memory string MS will be referred to below as "NAND cell unit NU".

As will be mentioned later, the memory cell MC has a structure in which a control gate electrode (word line) is provided, via a memory layer including a charge accumulation layer, on a side surface of a columnar semiconductor film acting as a channel; and the drain side select transistor S1 and source side select transistor S2 have a structure in which a select gate electrode (select gate line) is provided, via a memory layer including a charge accumulation layer, on a side surface of a columnar semiconductor film. To simplify illustration, FIG. 1 illustrates the case where four memory cells MC are provided in one memory string MS, but the number of memory cells MC in one memory string MS is of course not limited to this.

The word line WL is commonly connected to memory cells adjacent in an X direction (word line direction) in FIG. 1. Moreover, the source side select gate line SGS is commonly connected to source side select transistors S2 adjacent in the word line direction, and the drain side select gate line SGD is commonly connected to drain side select transistors S1 adjacent in the word line direction. Note that in the description below, the source side select gate line SGS and the drain side select gate line SGD are sometimes collectively written simply as "select gate line". Moreover, the drain side select transistor S1 and the source side select transistor S2 are sometimes collectively written simply as "select transistor". Note that sometimes, one or a plurality of the memory cells MC closely adjacent to the source side select gate line SGS and the drain side select gate line SGD, of the memory cells MC in the memory string MS, is treated as a dummy cell not employed in data storage. There may be two or more dummy cells; moreover, it is also possible for the dummy cell to be omitted.

Furthermore, the bit lines BL are disposed so as to extend having as their longitudinal direction a Y direction (bit line direction) intersecting the X direction (word line direction), and are arranged with a certain pitch in the X direction. The bit line BL is connected to a plurality of the memory strings MS via the drain side select transistor S1. Although illustration thereof is omitted in FIG. 1, a source line SL is disposed having the Y direction as its longitudinal direction, for example, and is connected to the memory string MS via the source side select transistor S2.

The word line drive circuit 12 is a circuit that controls a voltage applied to the word line WL; the source side select gate line drive circuit 13 is a circuit that controls a voltage applied to the source side select gate line SGS; and the drain side select gate line drive circuit 14 is a circuit that controls a voltage applied to the drain side select gate line SGD. Moreover, the sense amplifier 15 is a circuit that amplifies a signal (voltage) read in the bit line BL from a selected memory cell. The word line drive circuit 12, the source side select gate line drive circuit 13, and the drain side select gate line drive circuit 14 each comprise a vertical type transistor Tr that comprises a columnar channel layer that extends having a stacking direction (first direction) as its longitudinal direction. This will be explained in detail later.

A stepped wiring portion CR is a wiring portion for connecting the word line WL and the select gate lines SGD and SGS to a contact. The word line WL and the select gate lines SGD and SGS have a step-processed structure enabling them to each be connected to the contact independently at their upper portions. An upper surface at an end of these step-processed wirings is configured as a contact connection region, and a contact plug 16 extends from that upper surface. Furthermore, an upper layer wiring 17 is formed at an upper end of that contact plug 16. The word line drive circuit 12, the source side select gate line drive circuit 13, and the drain side select gate line drive circuit 14 are connected to the stepped wiring portion CR via these contact plug 16 and upper layer wiring 17. Note that the stepped wiring portion CR is illustrated only in a side portion in the X direction of the memory cell array MR in FIG. 1. However, as will be mentioned later, the stepped wiring portion CR is formed so as to surround an entire periphery of the memory cell array MR, including a side portion in the Y direction of the memory cell array MR.

Figure 2:
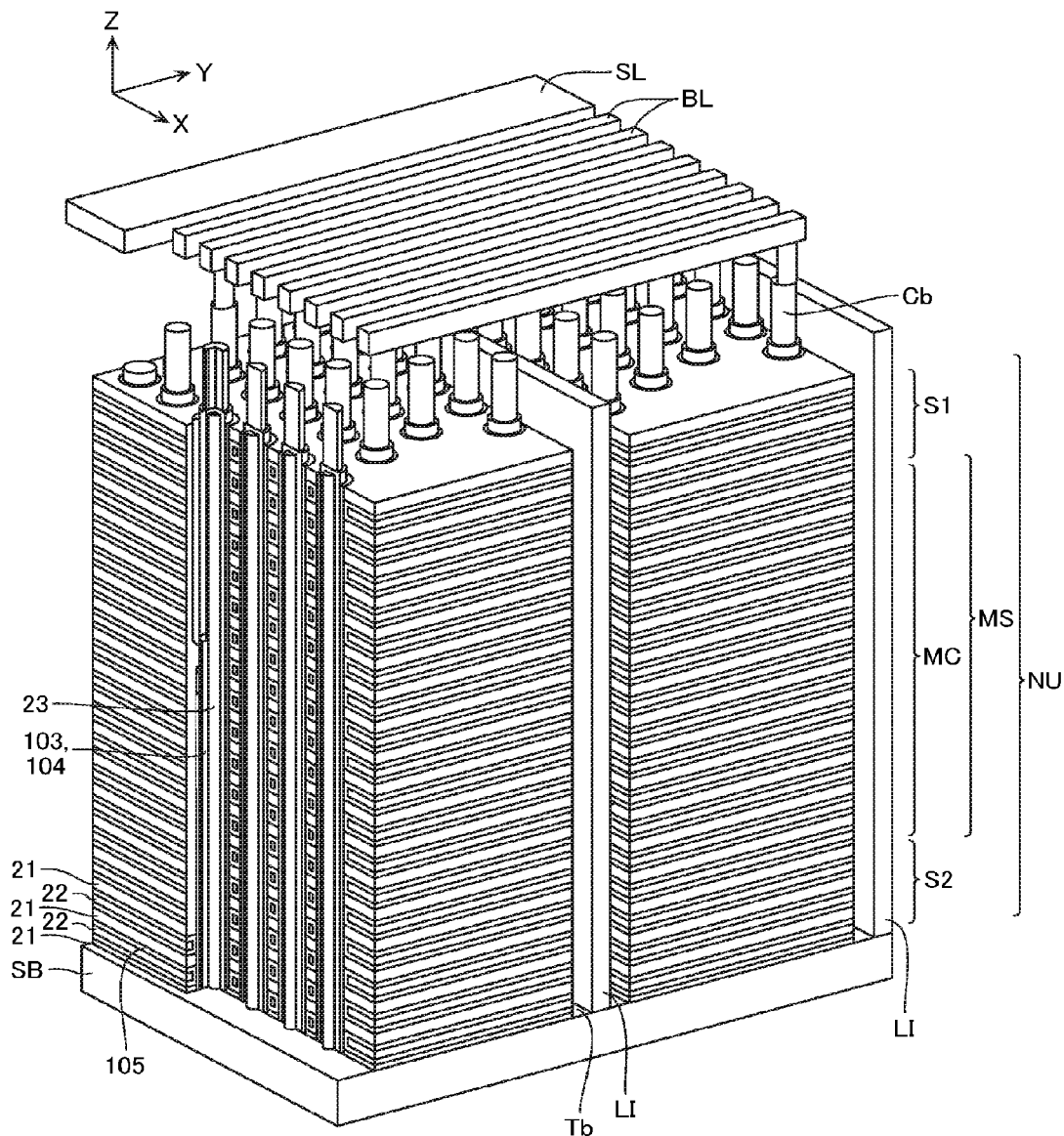
FIG. 2 is a perspective view showing a structure of part of a memory cell array MR of the first embodiment.
Figure 3:
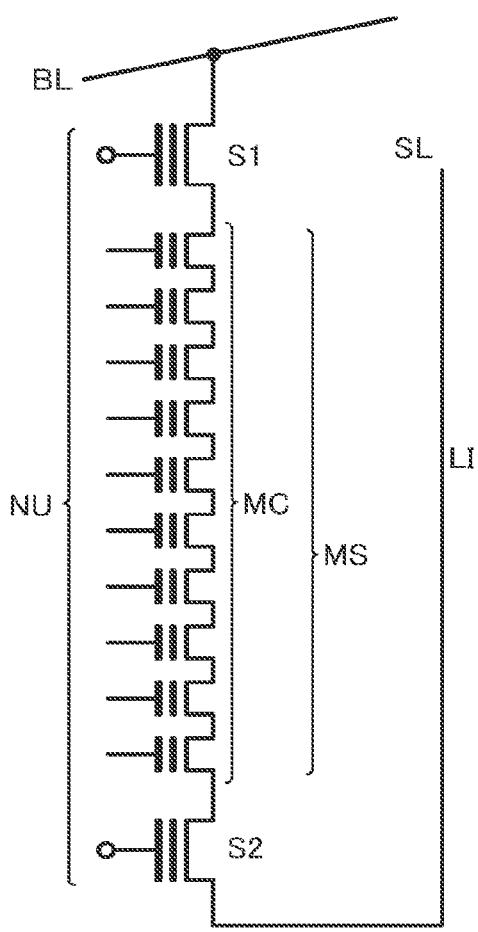
FIG. 3 is an equivalent circuit diagram of one NAND cell unit NU.
Figure 4:
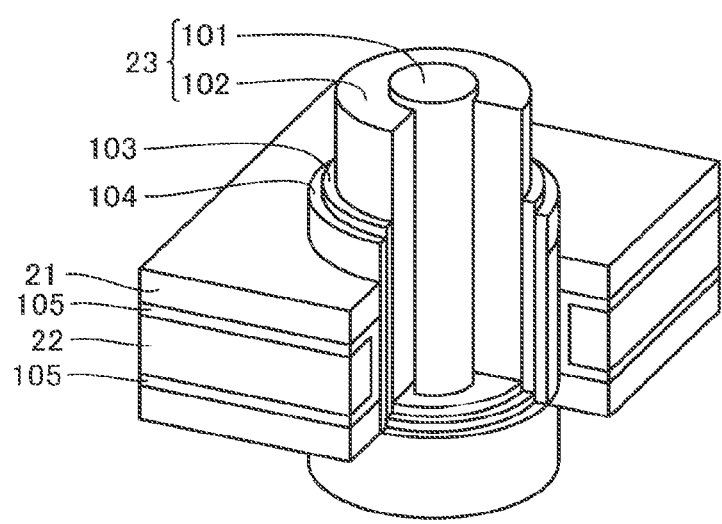

Next, details of a structure of the memory cell array MR will be described with reference to FIGS. 2 to 4. FIG. 2 is a perspective view showing a structure of part of the memory cell array MR; FIG. 3 is an equivalent circuit diagram of one NAND cell unit NU; and FIG. 4 is a perspective cross-sectional view of one memory cell MC, and so on.

As shown in FIG. 2, the memory cell array MR has a structure in which inter-layer insulating layers 21 and conductive layers 22 are stacked alternately on a semiconductor substrate SB, along a stacking direction perpendicular to an upper surface of the substrate SB. This conductive layer 22 functions as a control gate of the memory cell MC (word line WL), as the source side select gate line SGS, and as the drain side select gate line SGD. The inter-layer insulating layer 21 is disposed above and below these conductive layers 22, and electrically insulates fellow conductive layers 22.

The conductive layer 22 may be formed by, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromium silicide (CrSix), manganese silicide (MnSix), iron silicide (FeSix), ruthenium (Ru), molybdenum (Mo), titanium (Ti), titanium nitride (TiN), vanadium (V), chromium (Cr), manganese (Mn), iron (Fe), cobalt (Co), nickel (Ni), gold (Au), silver (Ag), or copper (Cu), or by a compound of these. However, the conductive layer 22 may also be formed by polysilicon to which an impurity is added.

Moreover, semiconductor layers 23 are arranged with a certain pitch in the XY plane, having a stacking direction (Z direction of FIG. 2) as their longitudinal direction, so as to penetrate a stacked body of such inter-layer insulating layers 21 and conductive layers 22. The following are formed between the semiconductor layer 23 and the stacked body of conductive layers 22 and inter-layer insulating layers 21, namely: a tunnel insulating layer 103; a memory layer 104 that includes the charge accumulation layer; and a block insulating layer 105. The memory layer 104 may be formed from a stacked structure of the charge accumulation layer of the likes of a silicon nitride film, and an oxide film of the likes of a silicon oxide film. The memory layer 104 may be configured as a floating gate structure employing a conductive film, instead of employing the likes of a silicon nitride film. A threshold voltage of the memory cell MC changes by an accumulated amount of charge to this charge accumulation layer, and the memory cell MC stores data corresponding to this threshold voltage.

The semiconductor layer 23 functions as a channel region (body) of the memory cell MC and the select transistors S1 and S2 included in the NAND cell unit NU. These semiconductor layers 23 are connected at their upper ends to the bit line BL via a contact Cb. The bit lines BL are arranged with a certain pitch in the X direction, having the Y direction as their longitudinal direction.

In addition, a lower end of the semiconductor layer 23 is electrically connected to the semiconductor substrate SB, and, as will be mentioned later, the lower end of the semiconductor layer 23 is connected to the source line SL via this substrate SB and a later-mentioned source contact LI. The source line SL is arranged having the Y direction as its longitudinal direction, similarly to the bit lines BL.

Note that the stacked body of inter-layer insulating layers 21 and conductive layers 22 in the memory cell array MR is divided on a block-by-block basis, the block being a minimum unit of data erase. A trench Tb is formed at a boundary of division, this trench Tb is implanted with an unillustrated inter-layer insulating layer, and the previously mentioned source contact LI is further formed penetrating that inter-layer insulating layer. This source contact LI has its lower end connected to the semiconductor substrate SB while having its upper end connected to the source line SL.

FIG. 3 is an equivalent circuit diagram of one NAND cell unit NU. In this memory cell array MR, one NAND cell unit NU comprises: the memory string MS configured from a plurality of the memory cells MC; the drain side select transistor S1 connected between the bit line BL and an upper end of the memory string MS; and the source side select transistor S2 connected between the source line SL and a lower end of the memory string MS.

One example of a specific structure of one memory cell MC is shown in FIG. 4. The columnar semiconductor layer 23 comprises: an oxide film core 101; and a columnar semiconductor 102 surrounding a periphery of the oxide film core 101. The oxide film core 101 is configured from, for example, a silicon oxide film (SiO2); and the columnar semiconductor 102 is configured from the likes of silicon (Si), silicon germanium (SiGe), silicon carbide (SiC), germanium (Ge), or carbon (C), for example, and may be formed by a single layer or by two layers.

Formed in a periphery of this columnar semiconductor 102 so as to surround the columnar semiconductor 102 are the tunnel insulating layer 103, the memory layer 104 including the charge accumulation layer, and the block insulating layer 105. The tunnel insulating layer 103 is configured from, for example, a silicon oxide film (SiOx), and functions as a tunnel insulating layer of the memory cell MC. The memory layer 104 includes the charge accumulation layer configured from, for example, a silicon nitride film (SiN), and functions to trap electrons injected via the tunnel insulating layer 103 from the columnar semiconductor 102 by a write operation. The block insulating layer 105 may be formed from, for example, a silicon oxide film.

The above-described tunnel insulating layer 103, memory layer 104, and block insulating layer 105 are referred to collectively as a gate insulating layer GL. In the case of FIG. 4, the gate insulating layer GL is configured by three layers, but, although conceivably having a variety of structures in which number or order, a material, and so on, of layers are made different, the memory gate insulating layer GL includes at least the above-described charge accumulation layer.

Note that also employable as a material of the tunnel insulating layer 103 and the block insulating layer 105, besides a silicon oxide film (SiOx), are, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, and so on.

In this example, the tunnel insulating layer 103 and the memory layer 104 are illustrated as being formed on an entire region of a side surface of the columnar semiconductor 102, but are not limited to this, and may also be formed only on a side surface of the word line WL.

Moreover, stacked alternately in a periphery of the columnar semiconductor 102, via the tunnel insulating layer 103, the memory layer 104, and the block insulating layer 105, so as to surround the columnar semiconductor layer 23, are the previously mentioned inter-layer insulating layer 21 and a tungsten electrode 108 functioning as the conductive layer 22.

Figure 5:
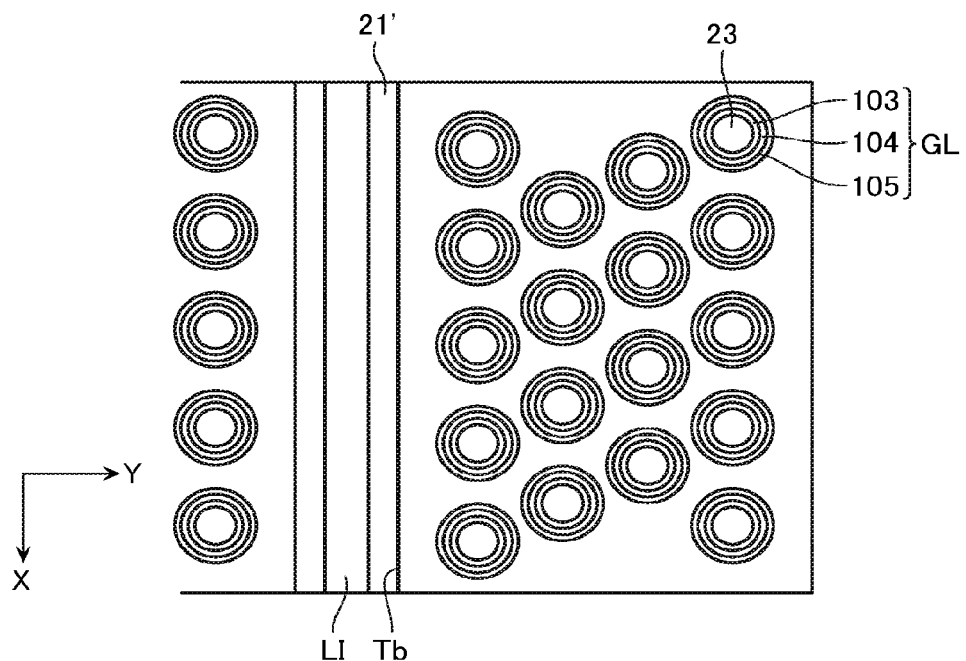
FIG. 5 is a plan view showing part of the memory cell array MR.

As shown in FIG. 5 which is a plan view of part of the memory cell array MR, the semiconductor layers 23 (columnar semiconductors 102) are arranged so as to be aligned in an oblique direction to the X direction (word line direction) and the Y direction (bit line direction), whereby an arrangement density of the semiconductor layers 23 is increased and an arrangement density of the memory cells MC is raised. One bit line BL extending in the Y direction is connected to any one of the semiconductor layers 23 arranged in this oblique direction, whereby only one memory string MS in one region (memory finger) sandwiched by two source contacts LI may be connected. However, this is merely an example, and it is also possible to configure such that the semiconductor layers 23 are aligned along the X direction and the Y direction. Moreover, the source contact LI is formed in a stripe having the X direction as its longitudinal direction, and is implanted within the trench Tb via an inter-layer insulating layer 21'.

Figure 6:
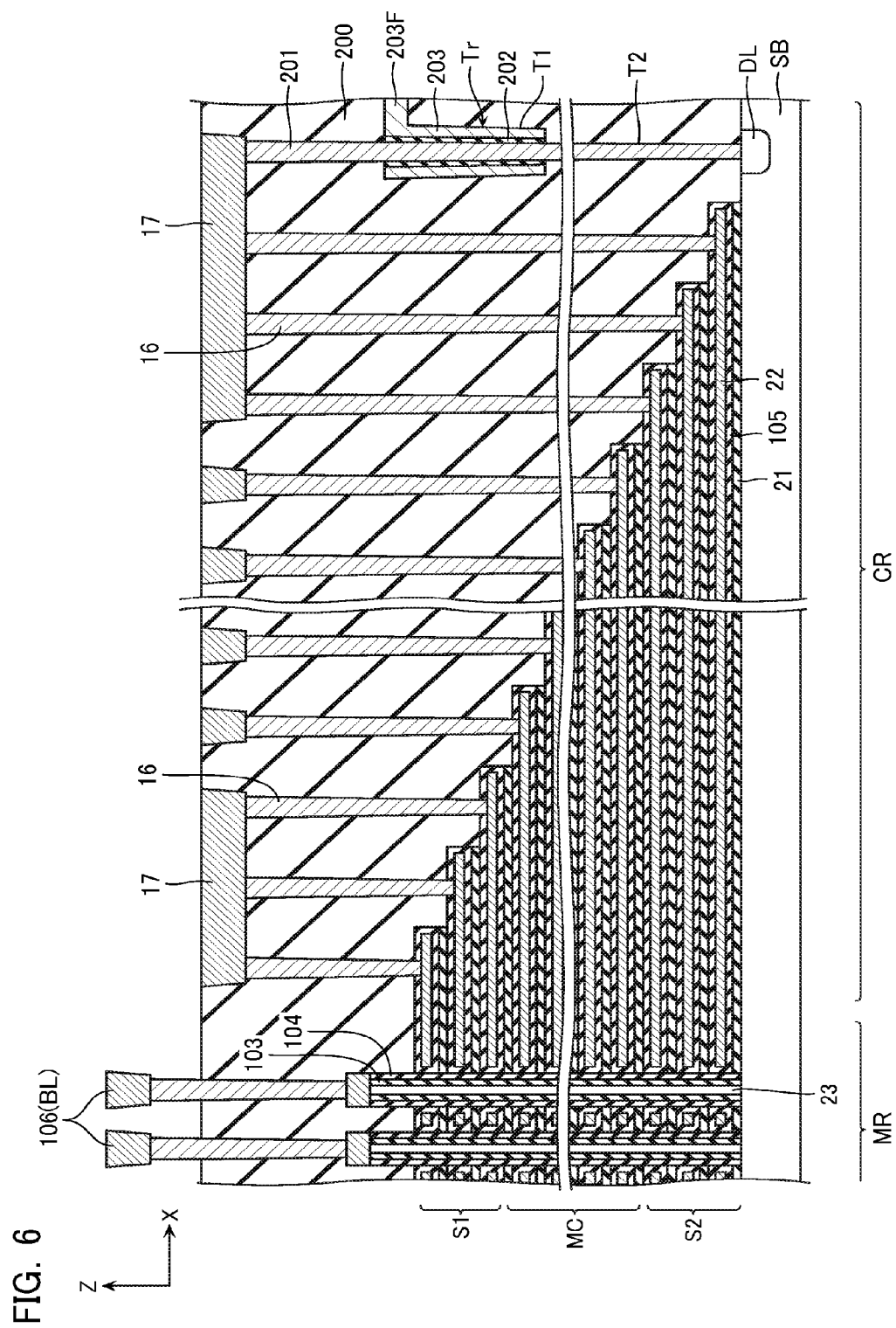
FIG. 6 is a cross-sectional view explaining structures of the memory cell array MR and a stepped wiring portion CR of the first embodiment.

FIG. 6 is a cross-sectional view explaining structures of the memory cell array MR and the stepped wiring portion CR. The semiconductor layer 23 is formed on the semiconductor substrate SB so as to extend in a perpendicular direction to the substrate SB and such that its bottom portion is positioned in the substrate SB. The following are formed sequentially in a portion upward of a surface of the substrate SB, of a side surface of the semiconductor layer 23, namely: the tunnel insulating layer 103 and memory layer 104 including the charge accumulation layer; and the block insulating layer 105. Furthermore, the stacked body in which the conductive layers 22 and the inter-layer insulating layers 21 are alternately stacked is formed around the semiconductor layer 23 via the tunnel insulating layer 103, the memory layer 104, and the block insulating layer 105.

Moreover, the semiconductor layer 23 is electrically connected at its lower end to the substrate SB. Note that in the illustrated example, the block insulating layer 105 is formed so as to cover upper and lower surfaces of the conductive layer 22, but the block insulating layer 105 may be formed only in a periphery of the semiconductor layer 23, similarly to the tunnel insulating layer 103 and the memory layer 104.

Figure 7:
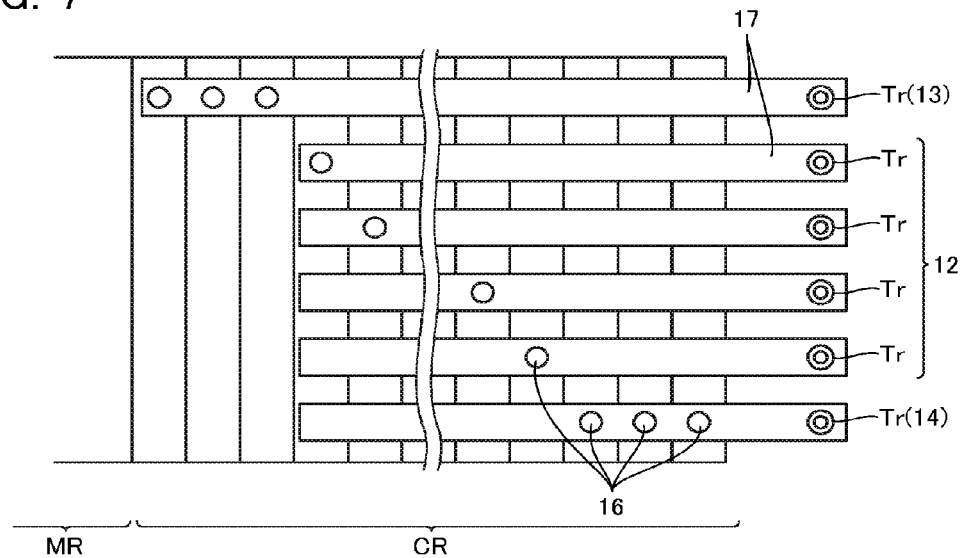
FIG. 7 is a plan view explaining an arrangement of transistors Tr.

As shown in FIG. 6, in the stepped wiring portion CR, the conductive layers 22 (second conductive layers) and the inter-layer insulating films 21 extended from the memory cell array MR are formed in a stepped shape where positions of their ends are different from each other. Moreover, the contact plug 16 extends from an upper surface of that stepped wiring portion (contact connection region), and the upper layer wiring 17 is formed at an upper end of that contact plug 16. As shown in FIG. 7, the upper layer wiring 17 preferably extends in the X direction, that is, a direction of a lowermost layer of the stepped wiring portion.

Note that in the example illustrated in FIG. 6, in the source side select transistor S2 and the drain side select transistor S1, three conductive layers 22 are short-circuited by the contact plug 16 and the upper layer wiring 17 to configure one select gate line.

Moreover, connected between this upper layer wiring 17 and the substrate SB is the vertical type transistor Tr that configures the word line drive circuit 12, the source side select gate line drive circuit 13, and the drain side select gate line drive circuit 14. In FIG. 6, one transistor Tr in the source side select gate line drive circuit 13 only is representatively illustrated, but an identical structure may be adopted also for the other transistors Tr. The transistors Tr are respectively connected to the independent word lines WL and select gate lines SGD and SGS aligned in the stacking direction. As shown in FIG. 7, in this embodiment, a plurality of the transistors Tr are arranged along the Y direction, adjacently to a lowermost layer portion of the stepped wiring portion CR. However, this is merely one example of a method of arrangement of the transistors Tr, and various other arrangement methods capable of reducing occupied area of the transistors Tr, may be adopted. Note that the transistor Tr connected to the bit line BL (FIG. 1) can also be configured having a similar structure.

As shown in FIG. 6, this transistor Tr comprises a columnar channel layer 201, a gate insulating film 202, and a gate electrode layer 203. The columnar channel layer 201 is a semiconductor layer configuring a channel portion of the transistor Tr. An upper end of the columnar channel layer 201 is connected to the stepped wiring portion CR via the contact plug 16 and the upper layer wiring 17. Moreover, a lower end of the columnar channel layer 201 is connected to a diffusion layer DL formed on the semiconductor substrate SB. This diffusion layer DL is part of a transistor (not illustrated) for controlling connection to an external circuit. A material of the columnar channel layer 201 may be monocrystalline silicon or polysilicon, but an oxide semiconductor (for example, InGaZnO, ZnO, $SnO_2$, and so on) which is a wide band gap material, is preferred. When an oxide semiconductor is adopted as the material, the transistor Tr can be configured as a so-called junctionless transistor not requiring a pn junction, and the transistor Tr can be manufactured by a fewer number of steps. Moreover, even when transistor Tr miniaturization has progressed, its conductivity can be maintained high.

The gate insulating film 202 is formed so as to surround a side surface of the columnar channel layer 201 and functions as a gate insulating film of the transistor Tr. A material of the gate insulating film 202 may be configured as a silicon oxide film (SiO2) and a silicon nitride film (SiN), but can also be configured as a metal oxide (for example, HfOx, and so on).

Figure 8:
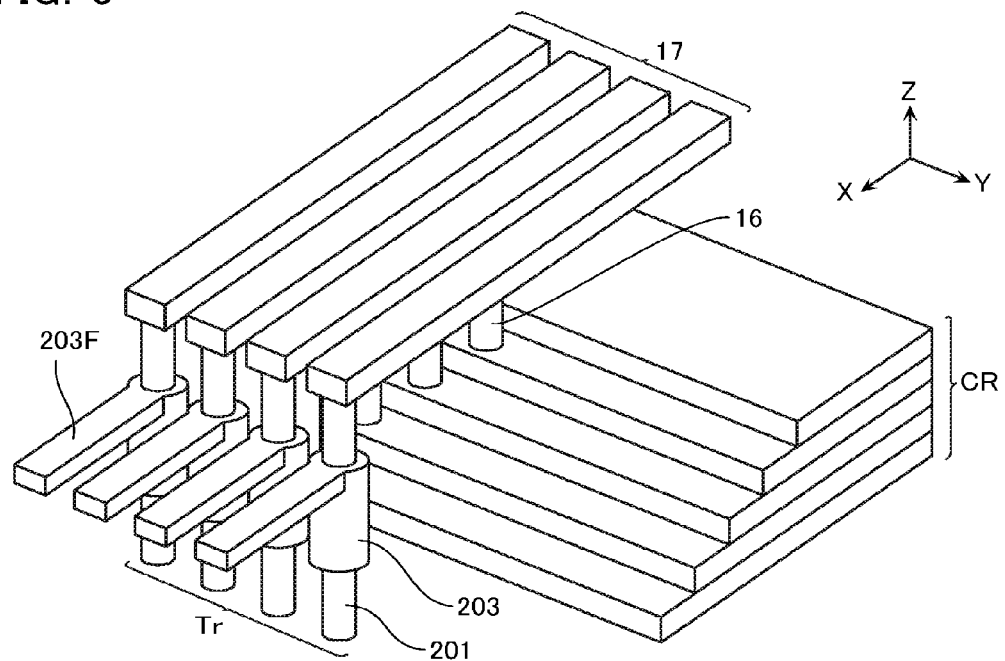
FIG. 8 is a perspective view explaining the arrangement and structure of the transistors Tr.

The gate electrode layer 203 is formed so as to surround a periphery of the gate insulating film 202 and functions as a gate electrode of the transistor Tr. Selectable as a material of the gate electrode layer 203 are the likes of tungsten (W), titanium (Ti), copper (Cu), titanium nitride (TiN), and tungsten nitride (WN). Moreover, the gate electrode layer 203 comprises a flange portion 203F (connecting portion) extending in a horizontal direction from close to an upper end of the gate electrode layer 203. This flange portion 203F is a conductive portion for making connection to the likes of an unillustrated contact plug to receive gate control from an external circuit. The flange portion 203F may be formed by an identical material to the material of the gate electrode layer 203, or may be of a different material. When the transistors Tr are arranged along the Y direction, this flange portion 203F is preferably formed so as to extend in the X direction (refer to FIG. 8). However, a longitudinal direction of the flange portion 203F is not limited to the X direction, and may be appropriately changed based on an orientation of the upper layer wiring 17 or arrangement of the transistors Tr.

Note that as previously mentioned, the stepped wiring portion CR can be formed not only on the side portion in the X direction but also on the side portion in the Y direction, of the memory cell array MR.

Next, a method of manufacturing the semiconductor memory device of the first embodiment will be described with reference to FIGS. 9A to 9G. As will be mentioned later, the stacked body of the conductive layers 22 and the inter-layer insulating films is formed by first, alternately stacking inter-layer insulating films and sacrifice films and removing the sacrifice films, and then implanting the conductive layer 22 in a cavity (air gap) where those sacrifice films have been removed. The conductive layer 22, from a viewpoint of reduction of its resistivity, is preferably configured having as its material a metal film of the likes of tungsten, for example. However, it is not easy for a memory hole MH that penetrates tungsten and a silicon oxide film, to be formed with high density. Therefore, as will be described next, a stacked body of the conductive layers 22 configured from the metal film and inter-layer insulating films 21 is formed by alternately stacking the inter-layer insulating films and sacrifice films and removing the sacrifice films, and then implanting the conductive layer 22 in the cavity where those sacrifice films have been removed. This will be described in detail below with reference to FIGS. 9A to 9G.

Figure 9A:
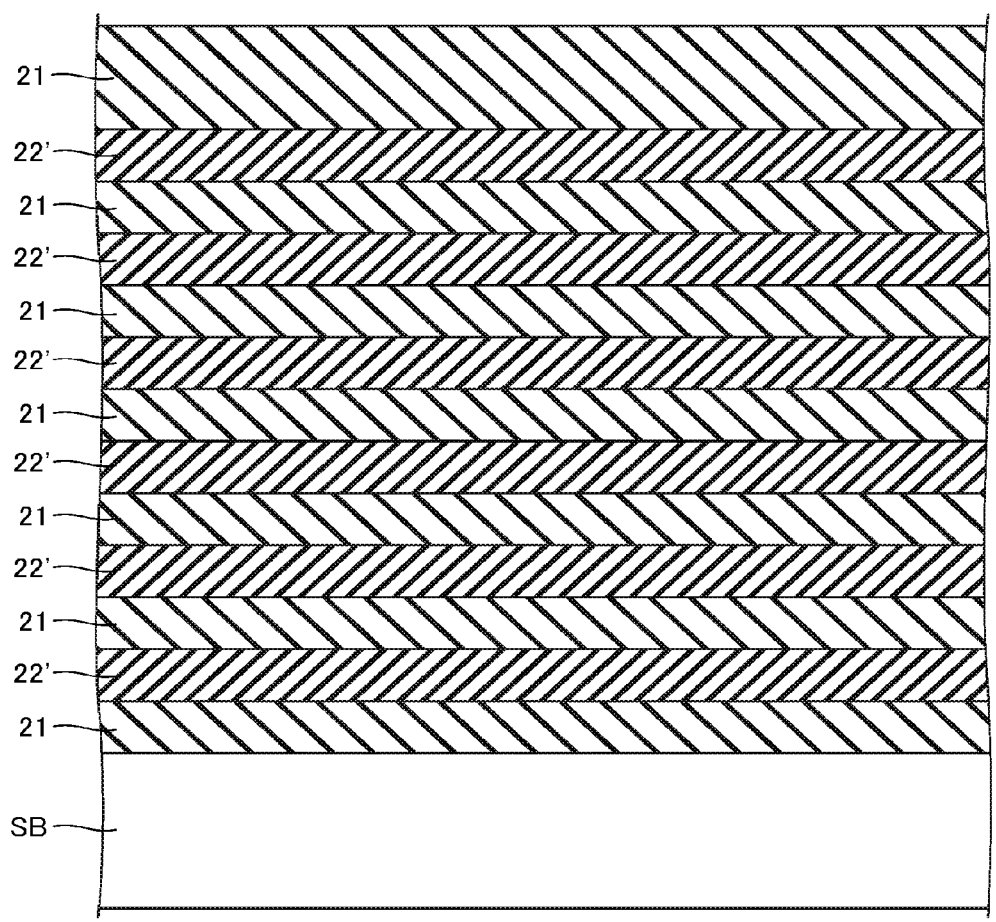
FIGS. 9A to 9G are a process drawing explaining a method of manufacturing the semiconductor memory device 100 of the first embodiment.

First, as shown in FIG. 9A, inter-layer insulating films 21 are stacked sandwiching sacrifice layers 22' between them, on the semiconductor substrate SB. When the inter-layer insulating film 21 is a silicon oxide film, the sacrifice layer 22' may be formed from a silicon nitride film (SiN).

Figure 9B:
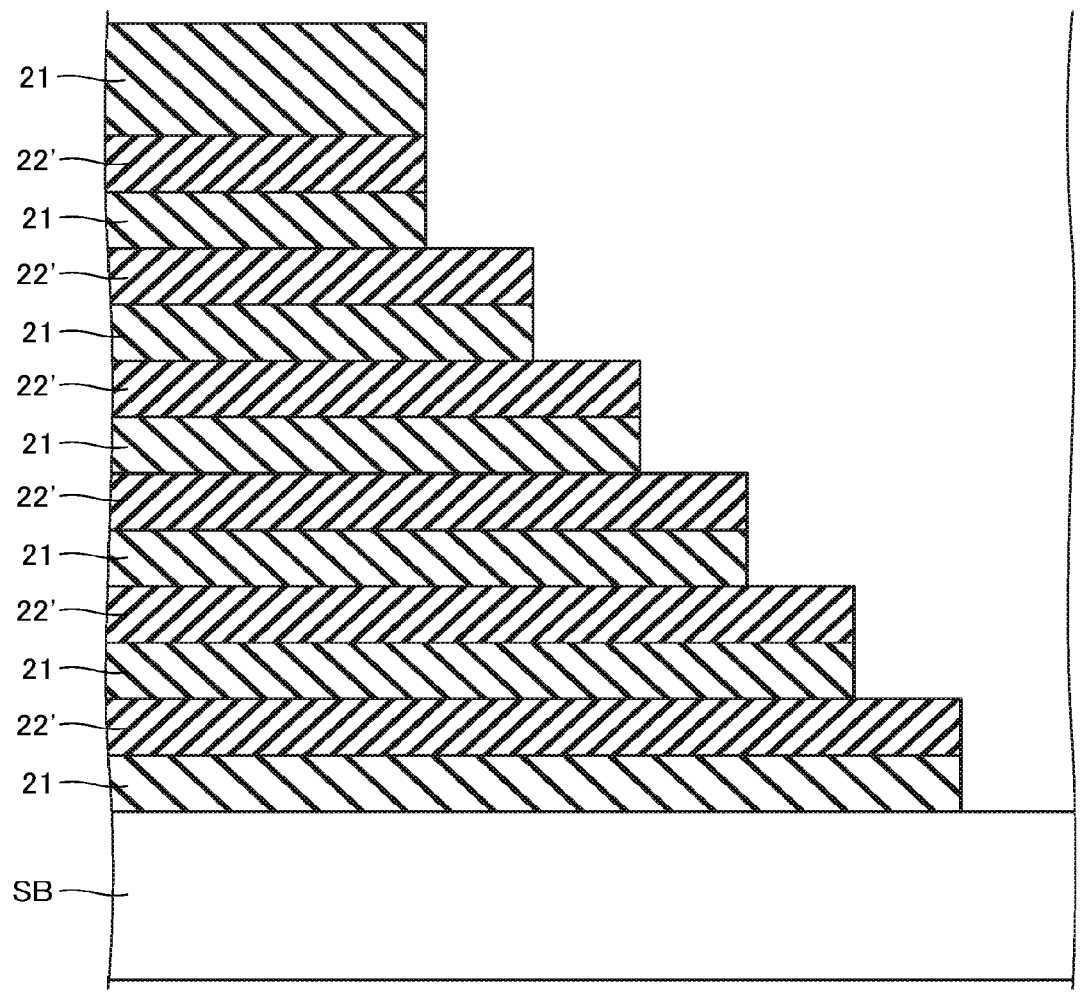
Figure 9C:
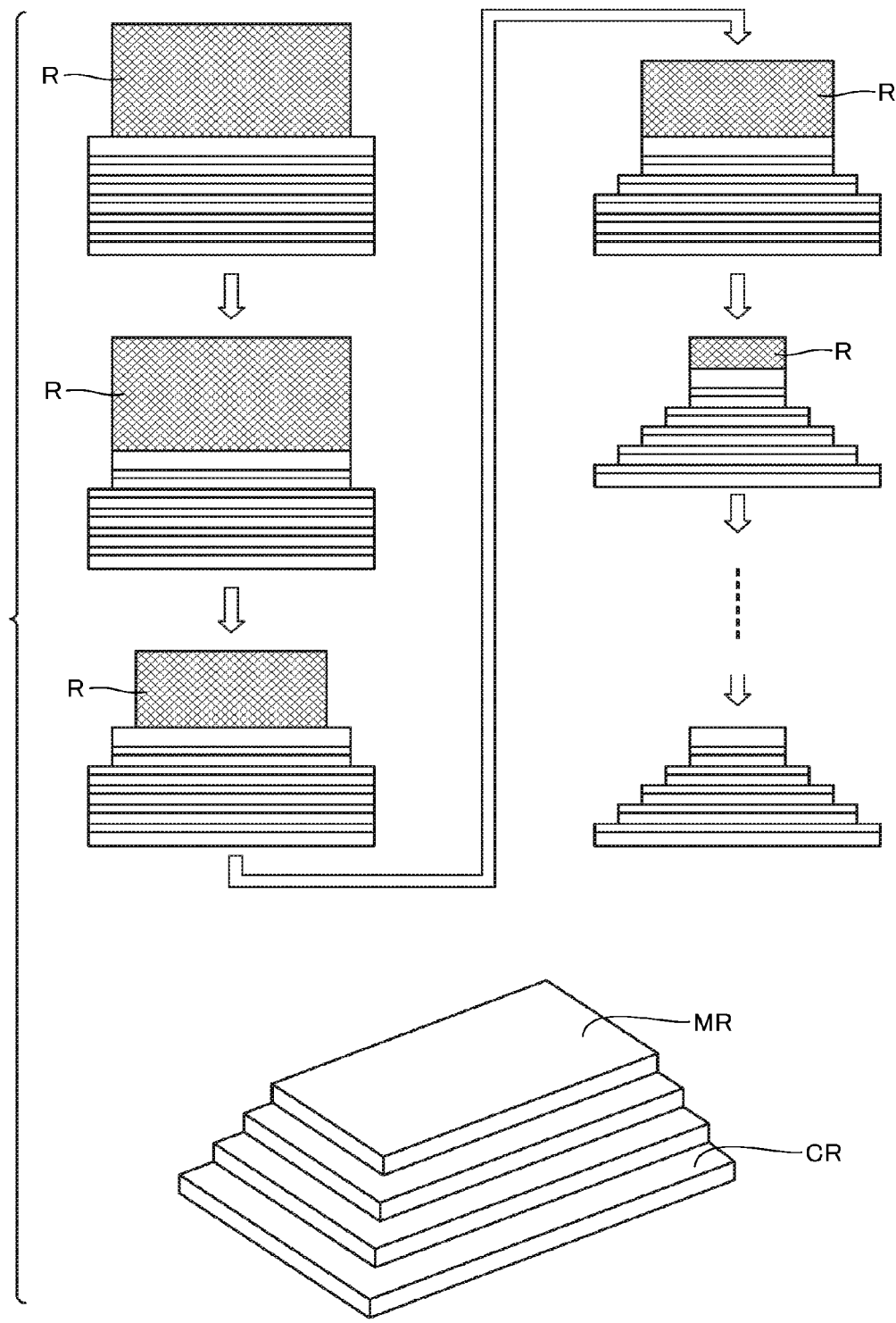

Next, as shown in FIG. 9B, a stepped shape is given to an end of the stacked body of sacrifice layers 22' and inter-layer insulating films 21, and the previously mentioned stepped wiring portion CR is formed. As shown in FIG. 9C, this stepped wiring portion is formed by coating an upper surface of the uppermost layer inter-layer insulating film 21 with a resist R and etching the sacrifice layers 22' and inter-layer insulating films 21 while gradually performing slimming processing of this resist R. The slimming is executed isotropically, hence the stepped wiring portion CR is formed so as to cover an entire periphery of the memory cell array MR.

Figure 9D:
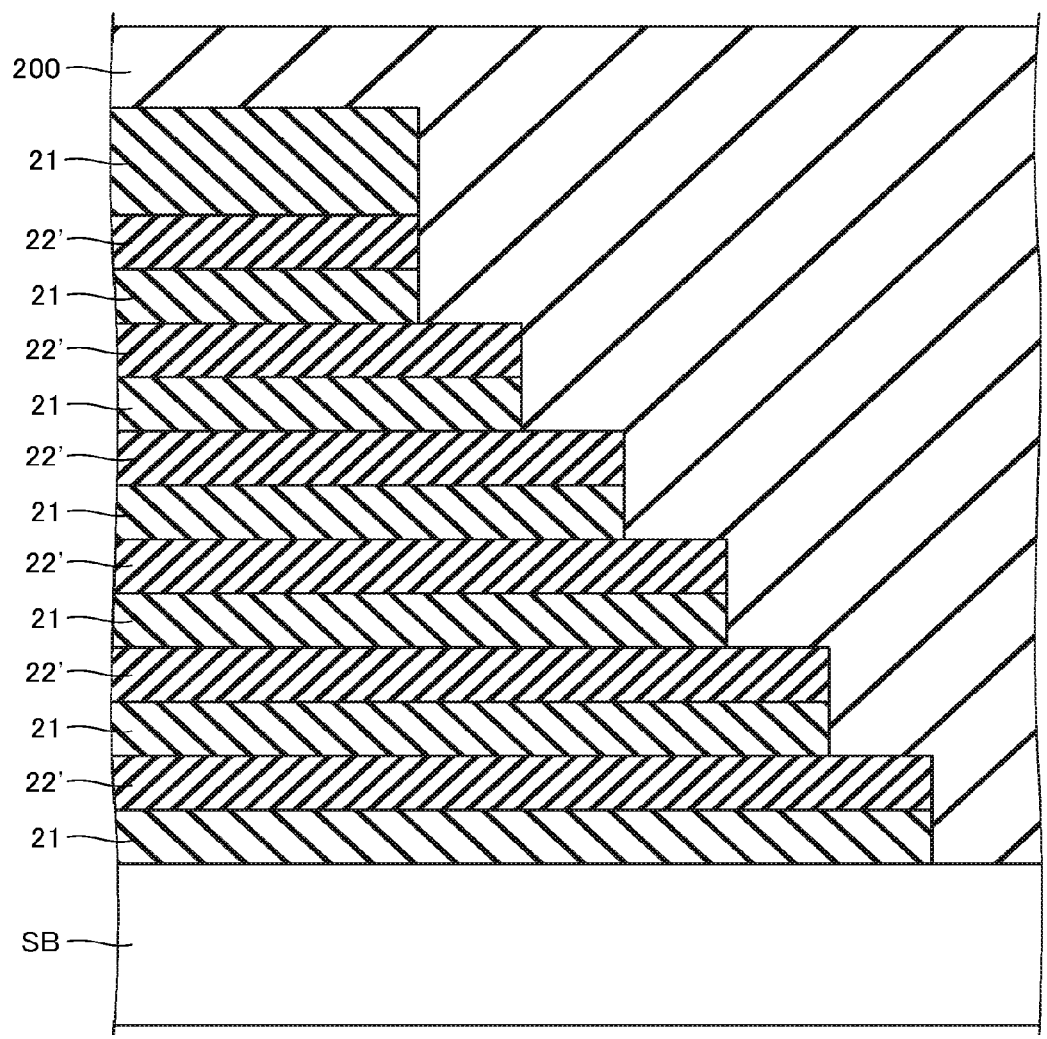
Figure 9E:
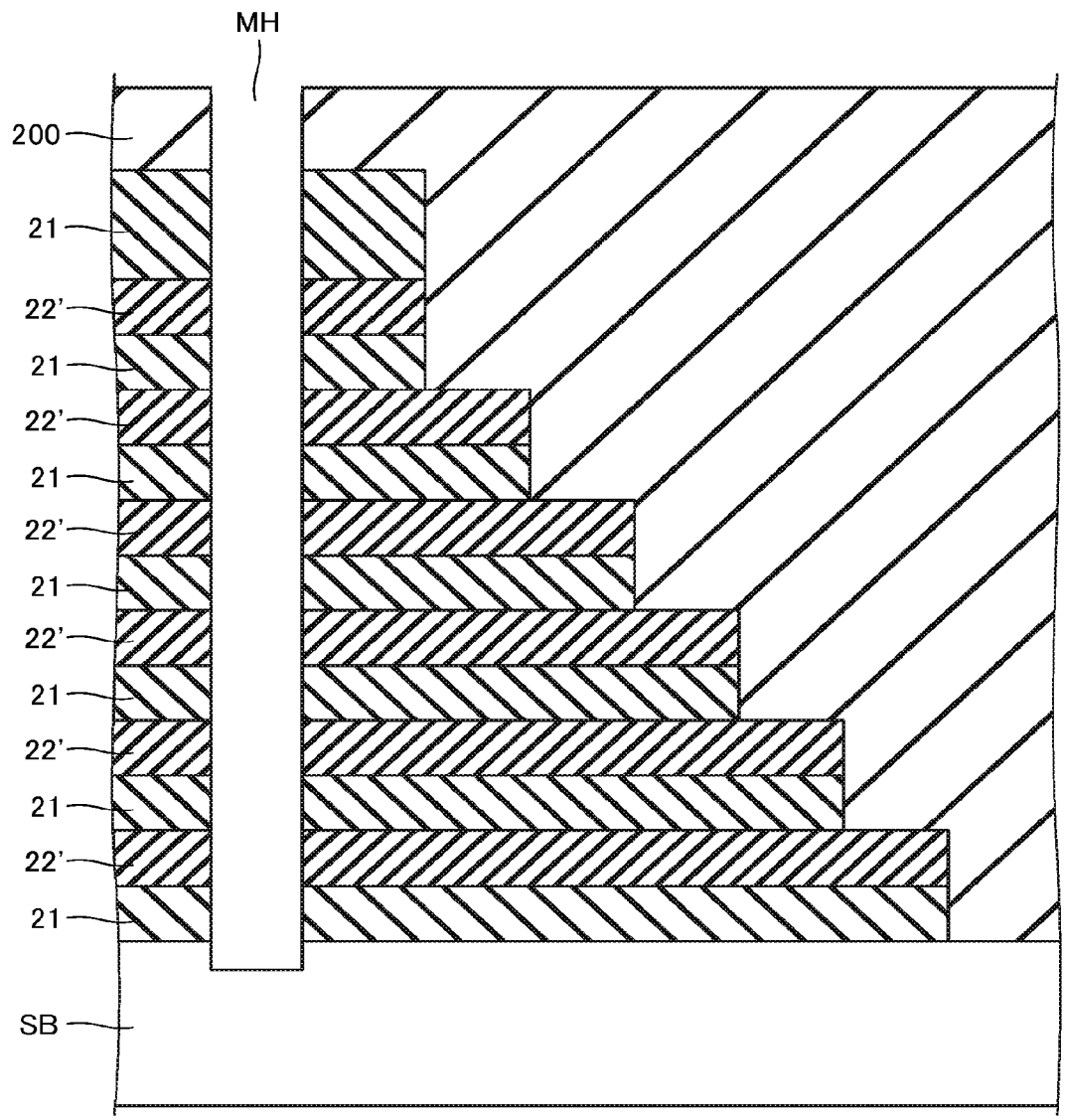

Next, as shown in FIG. 9D, an inter-layer insulating film 200 is deposited so as to fill over this stacked body. Then, as shown in FIG. 9E, the memory hole MH is formed, using photolithography and etching technology, in a portion where the memory cell array MR is to be formed, of the stacked body of sacrifice layers 22' and inter-layer insulating films 21.

Figure 9F:
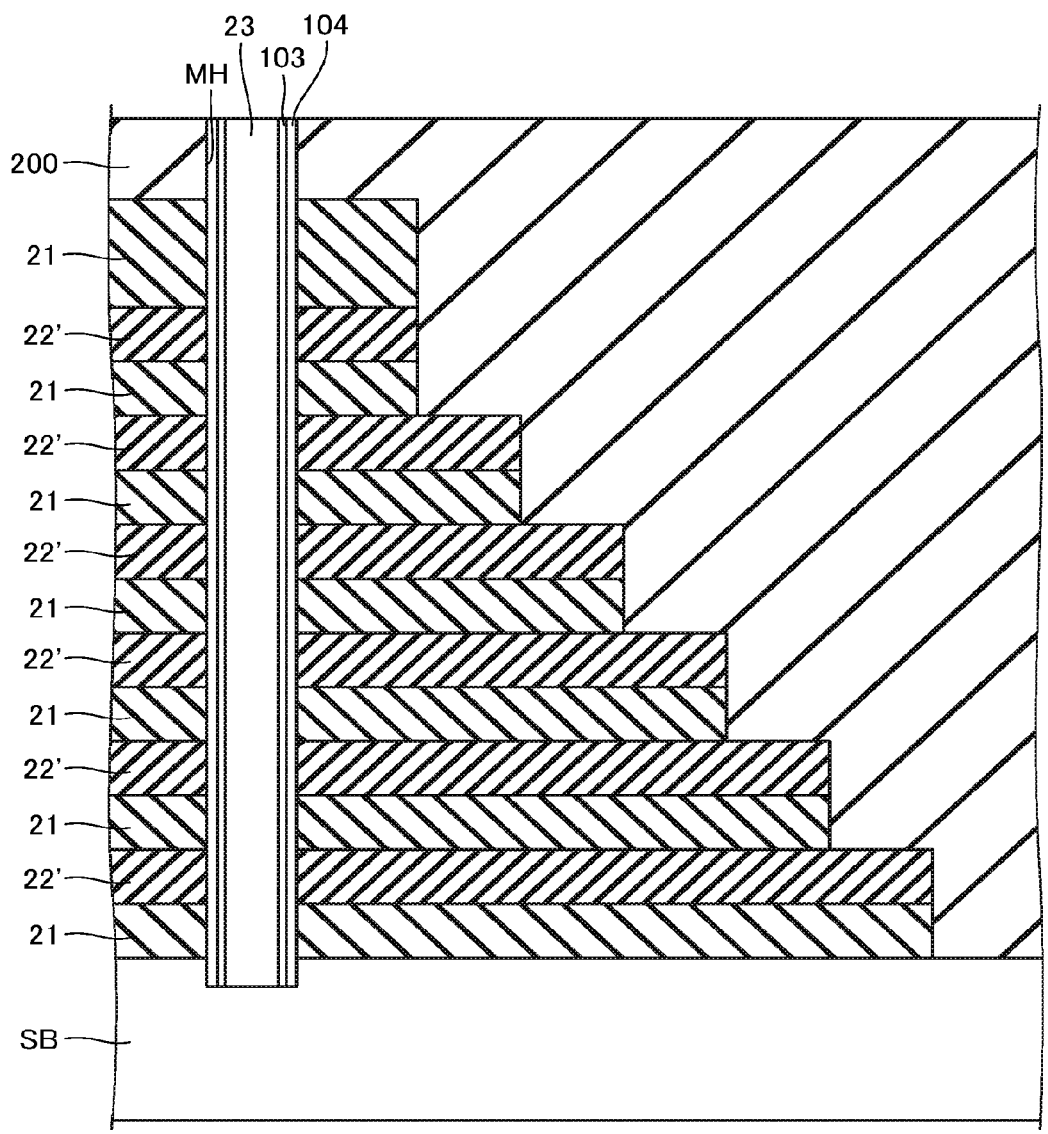

Furthermore, as shown in FIG. 9F, the previously mentioned memory layer 104 and tunnel insulating layer 103 are deposited sequentially on a sidewall of this memory hole MH using a plasma CVD method, or the like. Subsequently, the previously mentioned semiconductor layer 23 is formed so as to fill the inside of the memory hole MH, and a memory unit MU is formed. The semiconductor layer 23 is formed by, for example, depositing amorphous silicon, and then crystallizing the amorphous silicon by a certain thermal step.

Figure 9G:
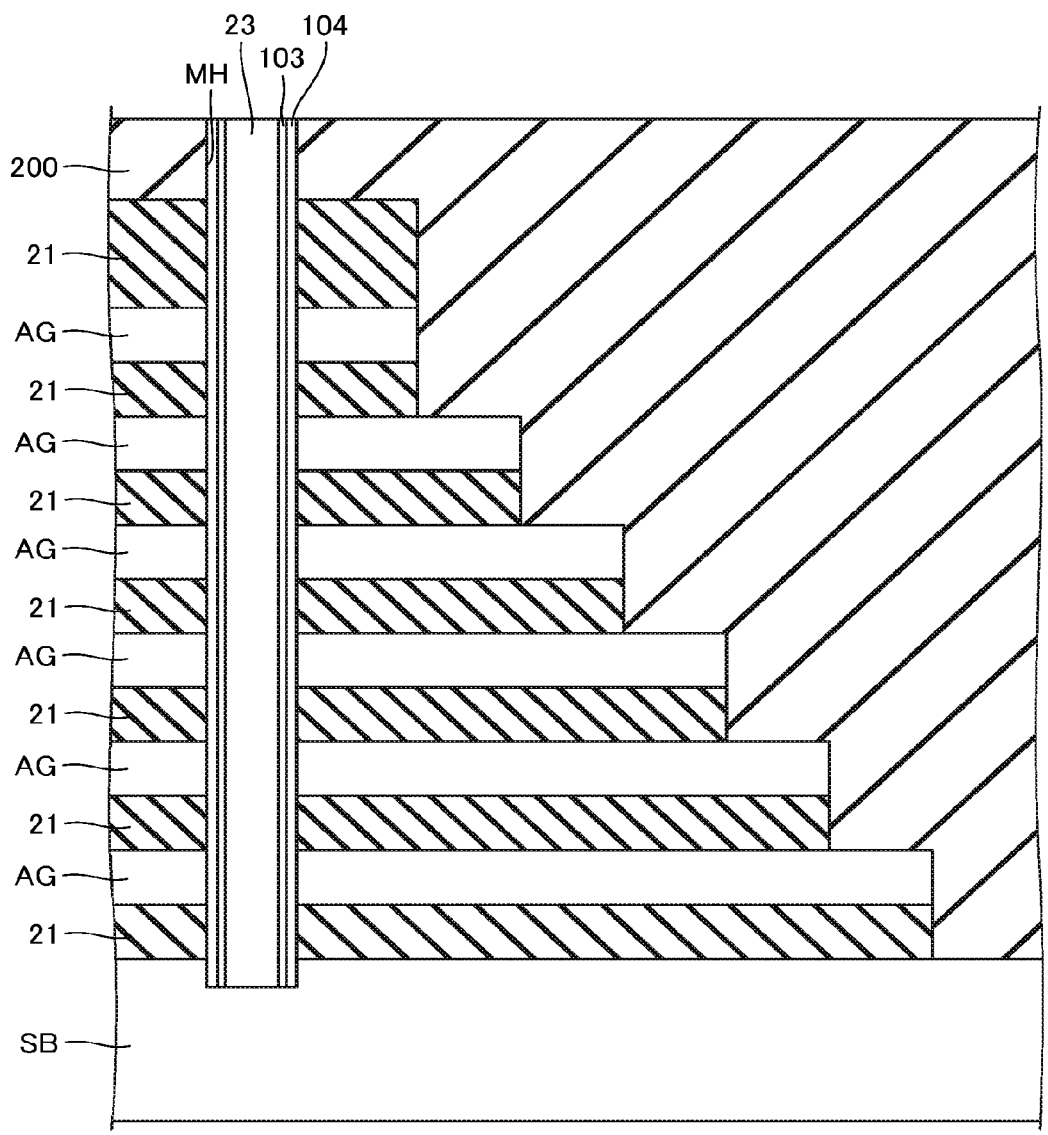

After this memory unit MU has been formed, RIE is executed to form the trench Tb (FIG. 5) penetrating the inter-layer insulating films 21 and sacrifice layers 22'. Then, wet etching employing a hot phosphoric acid solution is executed via the trench Tb. As a result, the sacrifice layer 22' is removed as shown in FIG. 9G. After the sacrifice layer 22' has been removed, an air gap AG is formed. Subsequently, the block insulating film 105 is formed to a certain film thickness on a wall surface of this air gap AG using the likes of a CVD method, and then a metal such as tungsten is implanted in the remaining air gap AG, whereby the stacked structure shown in FIG. 6 is completed. Note that the trench Tb has an insulating film such as a silicon oxide film formed therein, or is implanted with a conductive film (tungsten, or the like) which will be the source contact LI, via a sidewall film such as a silicon insulating film.

Next, a procedure of formation of the transistor Tr will be described with reference to FIGS. 10A to 10E.

Figure 10A:
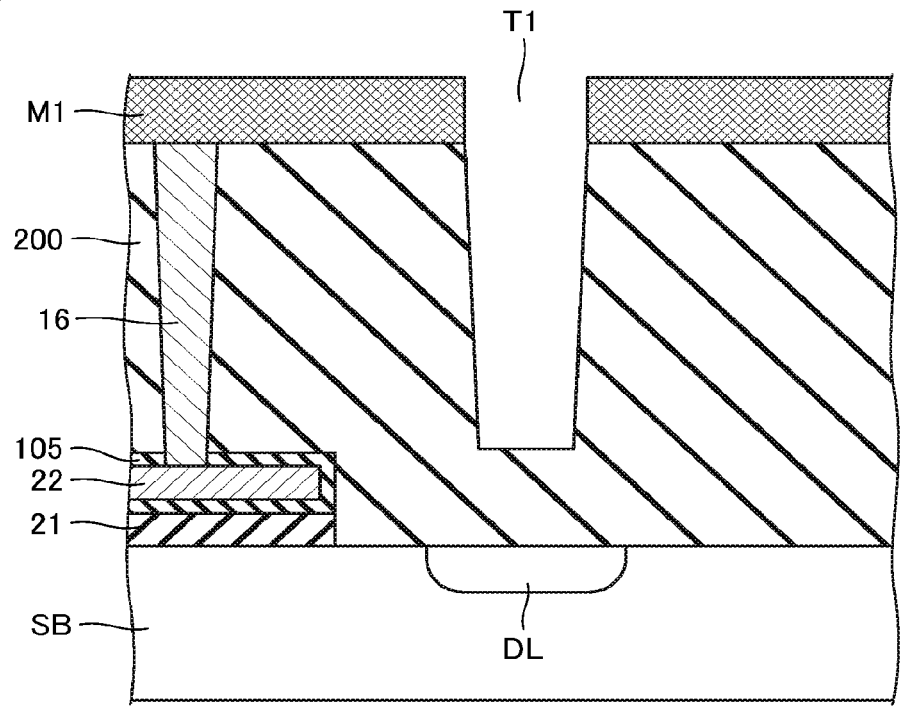
FIGS. 10A to 10E are the process drawing explaining the method of manufacturing the semiconductor memory device 100 of the first embodiment.

First, as shown in FIG. 10A, a trench T1 for forming the transistor Tr is formed, by reactive ion etching (RIE) employing a mask M1, at the end of the stepped wiring portion CR (close to an end of the lowermost layer conductive layer 22). A large number of the trenches T1 are formed along a perpendicular direction to a plane of paper of FIG. 10A. However, the trench T1 is dug out to a degree of height that its bottom portion does not reach the semiconductor substrate SB. Note that it is also possible for this trench T1 and a trench for implanting the contact plug 16 to be formed simultaneously.

Figure 10B:
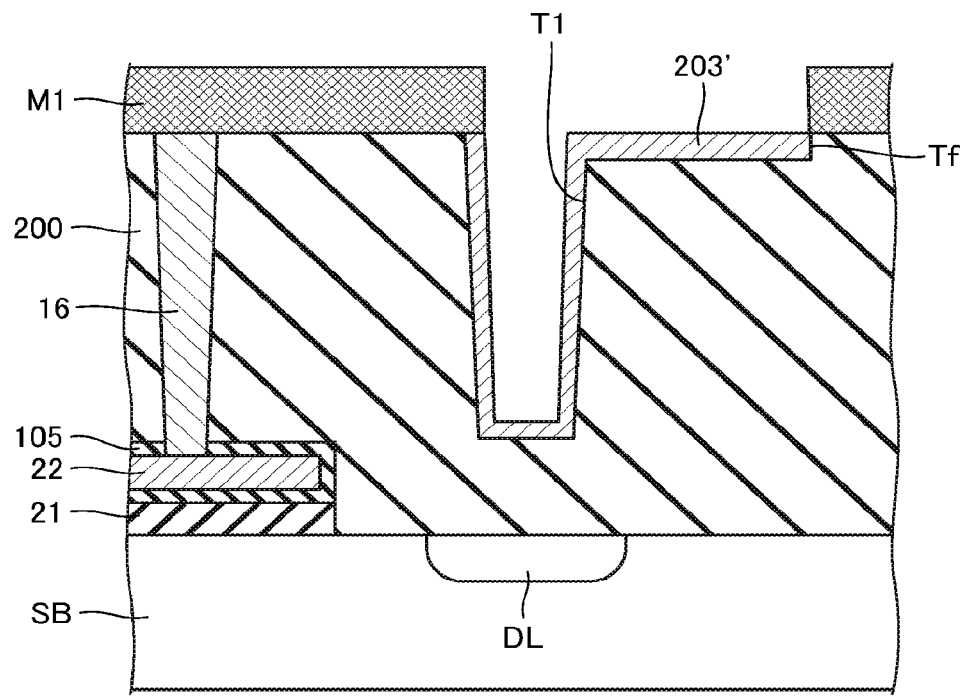

Next, as shown in FIG. 10B, the mask M1 is partially etched to form a trench Tf for forming the above-mentioned flange portion 203F. This trench Tf is formed so as to extend, having the X direction as its longitudinal direction, from an upper portion of the trench T1. Then, a metal film 203' is deposited, using the likes of an ALD method, so as to fill this trench Tf and a bottom surface and side surface of this trench T1. This metal film 203' configures the previously mentioned gate electrode layer 203 and flange portion 203F.

Figure 10C:
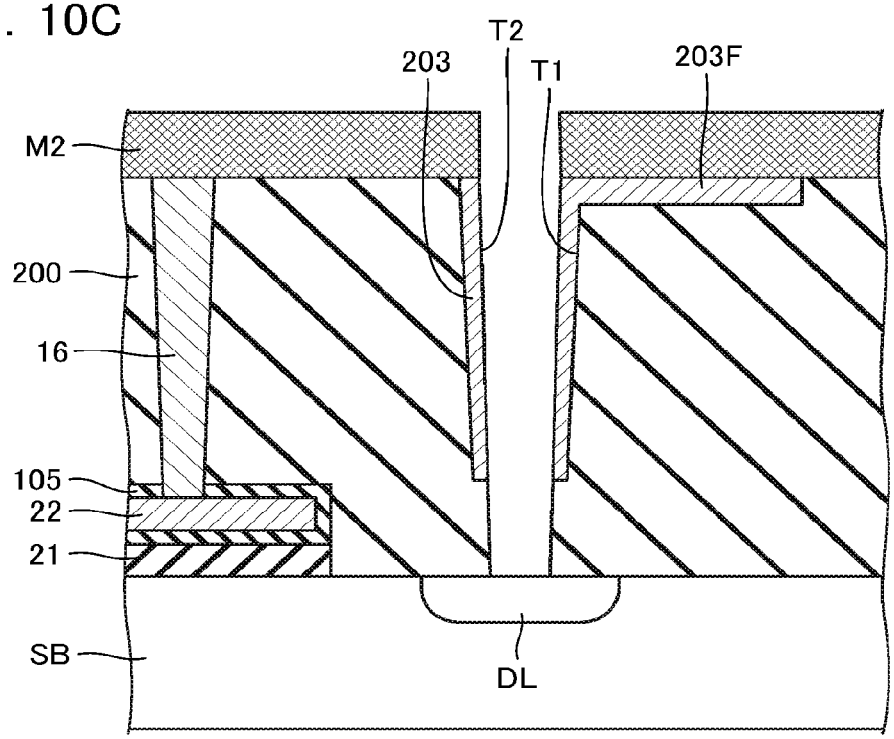
Figure 10D:
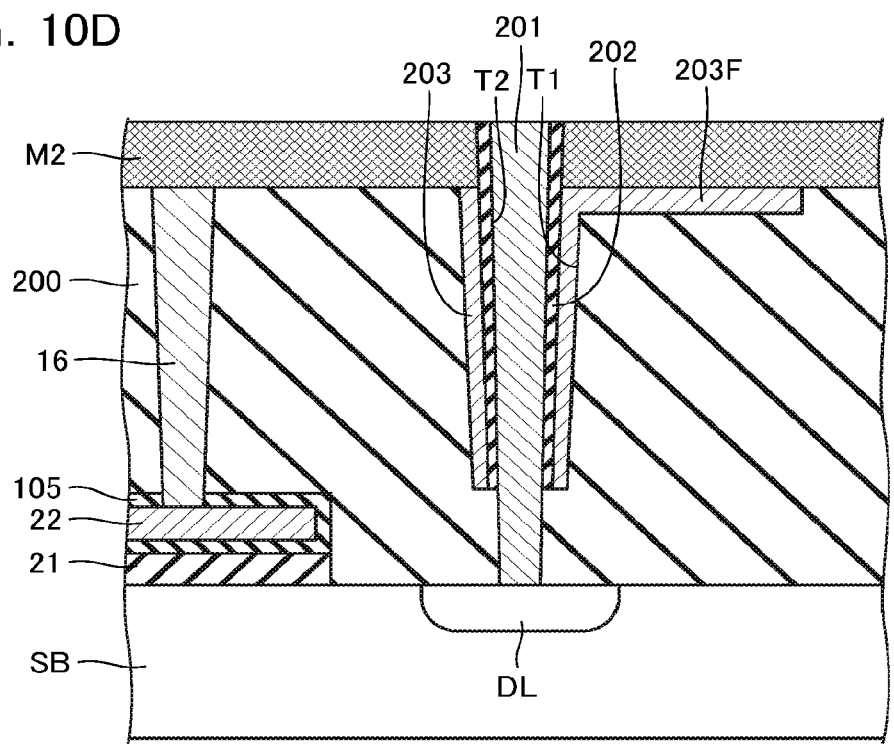
Figure 10E:
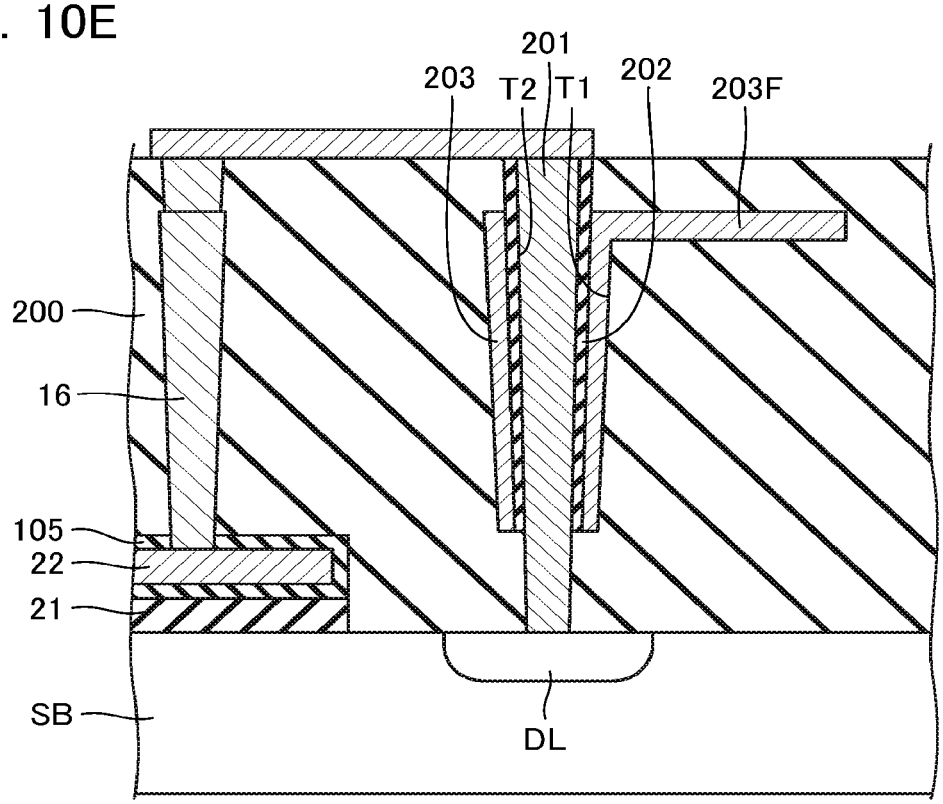

Next, as shown in FIG. 10C, the mask M1 is detached, and a mask M2 having an opening only in the trench T1 is newly deposited. Then, the metal film 203' and the inter-layer insulating film 200 in a layer below the metal film 203' are penetrated by RIE employing this mask M2, thereby forming a trench T2 that reaches the substrate SB. Then, as shown in FIG. 10D, the likes of a CVD method, for example, is employed to deposit the gate insulating film 202, and then the likes of an ALD method is further employed to deposit the columnar channel layer 201, along a sidewall of this trench T2. The columnar channel layer 201 may be formed having as its material an oxide semiconductor such as InGaZnO, for example. By being formed in this way such that a lower end of the columnar channel layer 201 is connected to the diffusion layer DL, a structure of the transistor Tr is completed. Subsequently, as shown in FIG. 10E, the columnar channel layer 201 and the contact plug 16 are connected by the likes of the upper layer wiring 17, the inter-layer insulating film 200 is further deposited, and a surface shape is planarized by the likes of a CMP method, whereby the structure shown in FIG. 6 is completed.

As described above, in the method of manufacturing of the present embodiment, the gate electrode layer 203 is formed along the trench T1 that does not reach the semiconductor substrate SB, and then the trench T2 that does reach the semiconductor substrate SB is further formed. Therefore, contact between the gate electrode layer 203 and the semiconductor substrate SB is avoided, and occurrence of metal contamination in the semiconductor substrate SB is avoided.

Moreover, having the trenches T1 and T2 formed by such a procedure results in a lower end of the gate electrode layer 203 being positioned more upwardly than a lower end of the columnar channel layer 201. In addition, it results in an upper end of the gate electrode layer 203 being positioned more downwardly than an upper end of the columnar channel layer 201. As a result, the columnar channel layer 201 not covered by the gate electrode layer 203 may function as a source/drain of the transistor Tr. As previously mentioned, this transistor Tr can be formed as a junctionless transistor in the case that the columnar channel layer 201 is formed having an oxide semiconductor as its material. In this case, an impurity implanting step for formation of the source/drain is not required, and a transistor Tr of small occupied area can be formed while the number of manufacturing steps is reduced.

As described above, as a result of the semiconductor device of the first embodiment, the transistor Tr having the columnar channel layer 201 that extends having as its longitudinal direction a stacking direction perpendicular to the substrate, is employed in the word line drive circuit 12, and so on. This columnar channel layer 201 has the stacking direction as its longitudinal direction, hence even if its channel length is increased to raise a withstand voltage, its occupied area in a substrate horizontal direction does not increase, and a large number of transistors Tr can be disposed with high density in a peripheral circuit region. That is, the present embodiment makes it possible to reduce the occupied area of the transistor Tr.

Second Embodiment

Figure 11:
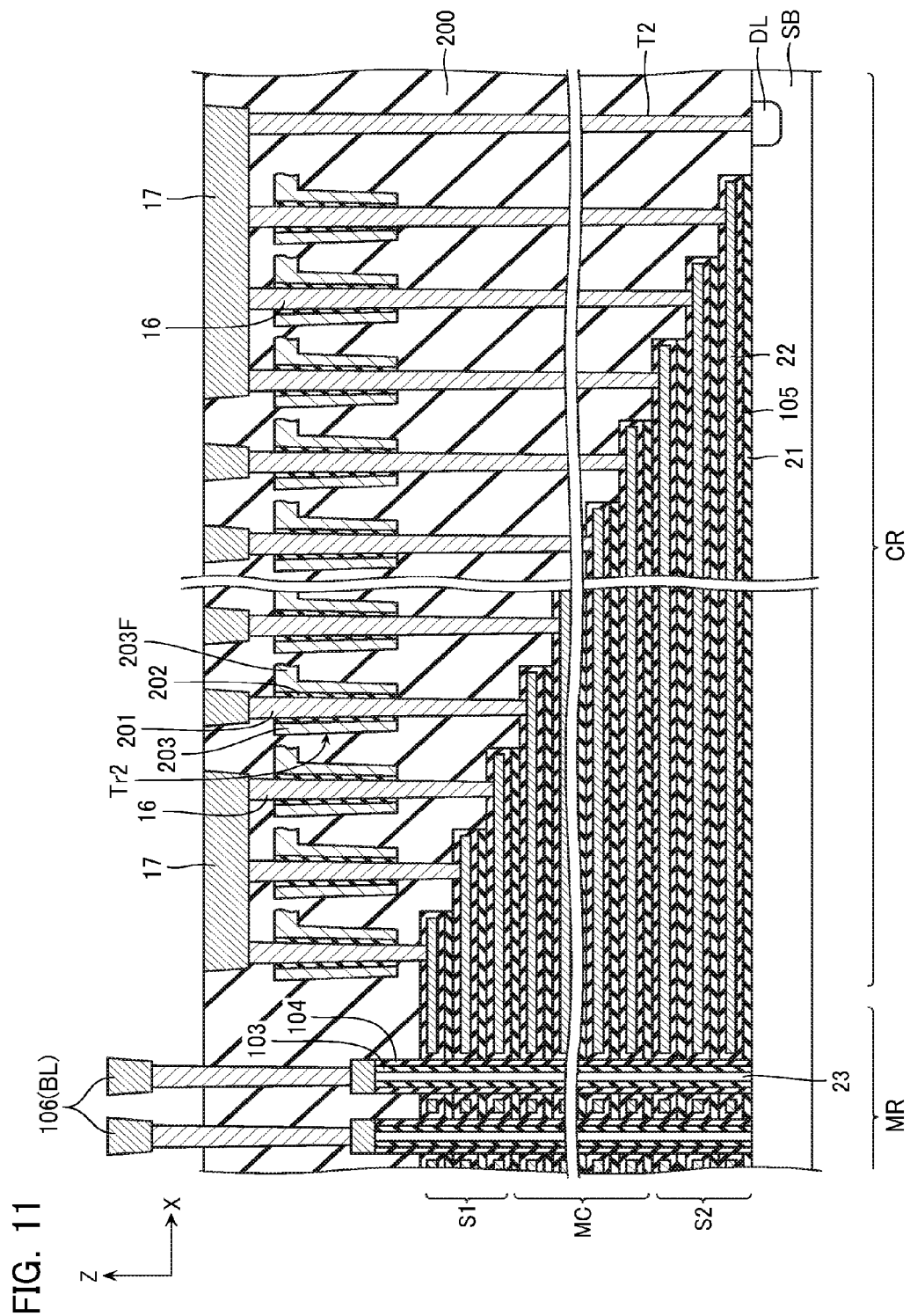
FIG. 11 is a cross-sectional view explaining a structure of a second embodiment.

Next, a semiconductor memory device according to a second embodiment will be described with reference to FIG. 11. FIG. 11 shows a cross-sectional view of a memory cell array MR and a stepped wiring portion CR of a semiconductor device of this second embodiment. A schematic configuration of the device is substantially identical to that of the first embodiment, hence a duplicated description thereof will be omitted.

In this second embodiment, a transistor Tr2 having a substantially identical structure to that of the transistor Tr of the first embodiment is connected between the upper layer wiring 17 and the conductive layer 22. In this respect, it is different from the transistor Tr of the first embodiment whose lower end is connected to the substrate SB. This embodiment also enables substantially identical advantages to those of the first embodiment to be displayed. Note that it is also possible for the transistor Tr of the first embodiment and the transistor Tr2 of the second embodiment to coexist in one device.

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above-described embodiments relate to a semiconductor memory device, but the present invention may be applied to a semiconductor device in general, besides a semiconductor memory device. That is, the present invention may be effectively applied in a semiconductor device having a stacked plurality of conductive layers and having a stepped wiring portion where these conductive layers are formed in a stepped shape.

What is claimed is:

1. A semiconductor device, comprising:
   a plurality of first conductive layers arranged above a substrate in a first direction intersecting an upper surface of the substrate; the conductive layers including a portion in which positions of ends of the first conductive layers made different from each other in a second direction intersecting the first direction; and
   a transistor electrically connected to the portion of the conductive layers, the transistor comprising:
a channel layer extending in the first direction;
a gate electrode layer disposed in a periphery of the channel layer; and
a gate insulating layer disposed between the channel layer and the gate electrode layer, wherein
the gate electrode layer comprises a connecting portion extending in a third direction intersecting the first direction.

2. The semiconductor device according to claim 1, wherein
the channel layer includes an oxide semiconductor.

3. The semiconductor device according to claim 2, wherein
the gate electrode layer comprises a connecting portion extending in a third direction intersecting the first direction.

4. The semiconductor device according to claim 2, wherein
a lower end of the channel layer is connected to the substrate.

5. The semiconductor device according to claim 2, wherein
a lower end of the channel layer is closer to the substrate than a lower end of the gate electrode layer.

6. The semiconductor device according to claim 2, wherein
a lower end of the channel layer is connected to the portion of the conductive layers.

7. The semiconductor device according to claim 2, further comprising
a memory cell array including memory cells arranged three-dimensionally therein,
wherein one of the memory cells arranged in the first direction is connected to any one of a plurality of the first conductive layers arranged in the first direction.

8. The semiconductor device according to claim 7, wherein
the gate electrode layer comprises a connecting portion extending in a third direction intersecting the first direction.

9. The semiconductor device according to claim 2, further comprising:
a second conductive layer extending in the first direction from the portion of the conductive layers; and
an upper layer wiring connected to an upper end of the second conductive layer,
wherein the channel layer is electrically connected to the portion of the conductive layers via the second conductive layer and the upper layer wiring.

10. The semiconductor device according to claim 1, wherein
a lower end of the channel layer is connected to the substrate.

11. The semiconductor device according to claim 1, wherein
a lower end of the channel layer is connected to the substrate.

12. The semiconductor device according to claim 1, wherein
a lower end of the channel layer is closer to the substrate than a lower end of the gate electrode layer.

13. The semiconductor device according to claim 1, wherein
a lower end of the channel layer is closer to the substrate than a lower end of the gate electrode layer.

14. The semiconductor device according to claim 1, wherein
a lower end of the channel layer is connected to the portion of the conductive layers.

15. The semiconductor device according to claim 1, further comprising
a memory cell array including memory cells arranged three-dimensionally therein,
wherein one of the memory cells arranged in the first direction is connected to any one of a plurality of the first conductive layers arranged in the first direction.

16. The semiconductor device according to claim 15, wherein
the channel layer includes an oxide semiconductor.

17. The semiconductor device according to claim 15, wherein
the gate electrode layer comprises a connecting portion extending in a third direction intersecting the first direction.

18. The semiconductor device according to claim 1, further comprising:
a second conductive layer extending in the first direction from the portion of the conductive layers; and
an upper layer wiring connected to an upper end of the second conductive layer,
wherein the channel layer is electrically connected to the portion of the conductive layers via the second conductive layer and the upper layer wiring.

* * * * *